United States Patent
Yamazaki et al.

(10) Patent No.: US 8,895,996 B2
(45) Date of Patent: Nov. 25, 2014

(54) LIGHT-EMITTING DEVICE AND LIGHTING DEVICE

(75) Inventors: Shunpei Yamazaki, Tokyo (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 1 day.

(21) Appl. No.: 13/368,449

(22) Filed: Feb. 8, 2012

(65) Prior Publication Data

US 2012/0205709 A1  Aug. 16, 2012

(30) Foreign Application Priority Data

Feb. 10, 2011 (JP) ................... 2011-027037

(51) Int. Cl.
*H01L 27/15* (2006.01)
*H01L 51/50* (2006.01)
*H01L 51/52* (2006.01)

(52) U.S. Cl.
CPC ........ *H01L 51/5278* (2013.01); *H01L 51/5092* (2013.01); *H01L 51/5088* (2013.01); *H01L 51/5044* (2013.01)
USPC ................. 257/79; 257/84; 257/103; 257/40; 257/642; 313/506; 313/498; 313/503

(58) Field of Classification Search
USPC ..................... 257/79–103, 40, 642, 257/E51.018–E51.026, E21.085
See application file for complete search history.

(56) References Cited

U.S. PATENT DOCUMENTS

| 7,893,427 B2 | 2/2011 | Kumaki et al. |
| 2006/0180812 A1 | 8/2006 | Sakata et al. |
| 2009/0289252 A1* | 11/2009 | Ikeda et al. ............... 257/43 |
| 2011/0156030 A1 | 6/2011 | Kumaki et al. |
| 2012/0138894 A1* | 6/2012 | Qian et al. ............... 257/13 |

FOREIGN PATENT DOCUMENTS

JP  2003-17262  1/2003

* cited by examiner

*Primary Examiner* — David Vu
*Assistant Examiner* — Cuong B Nguyen
(74) *Attorney, Agent, or Firm* — Husch Blackwell LLP

(57) ABSTRACT

A light-emitting device and a lighting device each including a light-emitting element which can recover from a short circuit between a pair of electrodes by itself without adversely affecting the characteristics of the element is provided. An oxide layer is provided so as to be in contact with an electrode of the light-emitting element, whereby, due to heat generated when a short circuit is caused between a pair of electrodes, oxygen in the oxide layer and an electrode material in a short-circuited part are reacted with each other and the electrode material in the short-circuited part can be an insulator. Further, by providing an oxide layer in contact with an electron-injection layer containing an alkaline earth metal, an oxide of the alkaline earth metal can be formed, whereby moisture that enters the insulator formed by an insulation phenomenon in the short-circuited part can be adsorbed and removed.

18 Claims, 8 Drawing Sheets

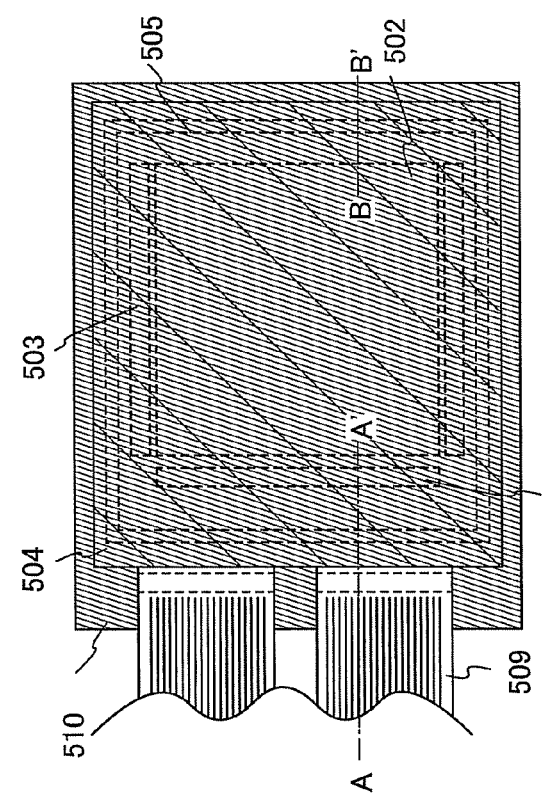
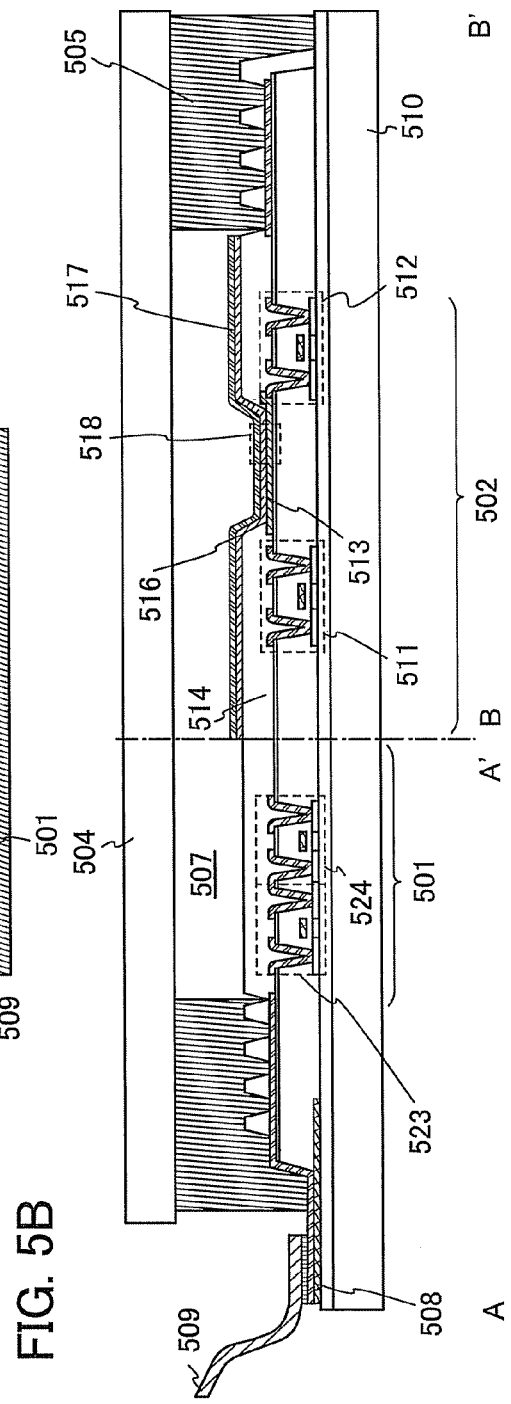
FIG. 5A
FIG. 5B

LIGHT-EMITTING DEVICE AND LIGHTING DEVICE

BACKGROUND OF THE INVENTION

1. Field of the Invention

The present invention relates to a light-emitting device and a lighting device each having a self-recovery function.

2. Description of the Related Art

In recent years, research and development have been extensively conducted on a light-emitting element using electroluminescence (EL). In a basic structure of such a light-emitting element, a layer containing a light-emitting substance (an EL layer) is interposed between a pair of electrodes. By voltage application to this element, light emission can be obtained from the light-emitting substance.

Since such a light-emitting element is of self-light-emitting type, it is considered that the light-emitting element has advantages over a liquid crystal display in that visibility of pixels is high, backlight is not required, and so on and is therefore suitable for a flat panel display element. Besides, such a light-emitting element has advantages in that it can be formed to be thin and lightweight, and has very high response speed.

Furthermore, since such a light-emitting element can be formed into a film shape, surface light emission can be easily obtained. Therefore, a large-area element using surface light emission can be formed. This is a feature which is difficult to obtain in point light sources typified by an incandescent lamp and an LED or linear light sources typified by a fluorescent lamp. Accordingly, a light-emitting element is extremely effective for use as a surface light source applicable to lighting and the like.

In order to manufacture a light-emitting element, the following process is generally employed, for example: after one of electrodes is formed, an EL layer is formed over the electrode, and the other of the electrodes is formed over the EL layer.

In the process in which the light-emitting element is manufactured as described above, an impurity may enter the light-emitting element for some reason. Such an impurity causes a defect in the electrode or the EL layer to adversely affect light emission of the light-emitting element. Even when a defect is not caused in the electrode or the EL layer, current flows in a concentrated manner in a region where the impurity exits in application of voltage to the light-emitting element and the region is locally heated to a high temperature; in such a case, a defect may be caused in the EL layer.

When a defect is caused in the EL layer of the light-emitting element, the possibility of occurrence of a short circuit between the pair of electrodes is increased; in the case where the short circuit is caused, the element cannot function as a light-emitting element.

As an example of a technique for preventing a short circuit between a pair of electrodes, a technique in which a defect in an EL layer is filled with an insulating material to prevent a short circuit between a pair of electrodes is given (e.g., see Patent Document 1).

REFERENCE

Patent Document

[Patent Document 1] Japanese Published Patent Application No. 2003-017262

SUMMARY OF THE INVENTION

Since the technique for preventing a short circuit described in Patent Document 1 is a technique using an electrodeposition method, there has been a problem in that although a defect where much current flows can be preferentially filled with an insulating material, a region other than the defect where much current flows is also covered with the insulating material. When the insulating material which is not necessary for the EL layer exists in the region other than the defect in the EL layer, the resistance of the light-emitting element is increased, which causes deterioration in characteristics of the light-emitting element.

In view of the above, an embodiment of the present invention provides a light-emitting device and a lighting device each including a light-emitting element which can recover from a short circuit between a pair of electrodes by itself without adversely affecting the characteristics of the light-emitting element.

In an embodiment of the present invention, an oxide layer is provided in a light-emitting element so as to be in contact with an electrode of the light-emitting element, whereby, due to heat generated when a short circuit is caused between a pair of electrodes of the light-emitting element, oxygen in the oxide layer and an electrode material in a short-circuited part are reacted with each other and the electrode material in the short-circuited part can be an insulator.

Further, by providing an oxide layer in contact with an electron-injection layer containing an alkaline earth metal, due to heat generated when a short circuit is caused between the pair of electrodes of the light-emitting element, oxygen in the oxide layer and the alkaline earth metal in the electron-injection layer are reacted with each other to form an oxide of the alkaline earth metal. Since a crack is caused in the short-circuited part, moisture (water vapor) is likely to enter the short-circuited part from the outside, but the oxide of the alkaline earth metal can adsorb the moisture that enters the short-circuited part to suppress deterioration of an EL layer around the short-circuited part.

Therefore, an embodiment of the present invention is a light-emitting device or a lighting device including an EL layer between a first electrode and a second electrode, in which: the EL layer includes at least a light-emitting layer, a first oxide layer, and a second oxide layer, the first oxide layer is formed between the first electrode and the light-emitting layer to be in contact with the first electrode, and the second oxide layer is formed between the second electrode and the light-emitting layer to be in contact with the second electrode.

Another embodiment of the present invention is a light-emitting device or a lighting device including an EL layer between a first electrode and a second,electrode, in which: the EL layer includes at least a light-emitting layer, a first oxide layer, a second oxide layer, a third oxide layer, and an electron-injection layer, the first oxide layer is formed between the first electrode and the light-emitting layer to be in contact with the first electrode, the second oxide layer is formed between the second electrode and the light-emitting layer to be in contact with the second electrode, the electron-injection layer is formed between the second electrode and the light-emitting layer to be in contact with the light-emitting layer, and the third oxide layer is formed between the second electrode and the light-emitting layer to be in contact with the electron-injection layer.

Another embodiment of the present invention is a light-emitting device or a lighting device including an intermediate layer between a first electrode and a second electrode, a first light-emitting layer between the first electrode and the intermediate layer, a second light-emitting layer between the second electrode and the intermediate layer, a first oxide layer between the first electrode and the first light-emitting layer, and in contact with the first electrode, and a second oxide layer between the second electrode and the second light-emitting layer and in contact with the second electrode.

Another embodiment of the present invention is a light-emitting device or a lighting device including an intermediate layer between a first electrode and a second electrode, a first light-emitting layer between the first electrode and the intermediate layer, a second light-emitting layer and an electron-injection layer in contact with the second light-emitting layer between the second electrode and the intermediate layer, a first oxide layer between the first electrode and the first light-emitting layer and in contact with the first electrode, a second oxide layer between the second electrode and the second light-emitting layer and in contact with the second electrode, and a third oxide layer in contact with the electron-injection layer.

In the above structure, the first oxide layer, the second oxide layer, and the third oxide layer may each contain a transition metal oxide or an oxide of a metal belonging to any of Group 4 to Group 8 of the periodic table. In addition, the concentration of oxygen in each of the first oxide layer, the second oxide layer, and the third oxide layer may be higher than or equal to 50 at. % and lower than or equal to 80 at. %.

In addition, in the above structure, the electron-injection layer may contain an alkaline earth metal.

In accordance with an embodiment of the present invention, it is possible to provide a light-emitting element having a self-recovery function with which an electrode material in a short-circuited part can be an insulator when a short circuit is caused between a pair of electrodes, where the characteristics of the light-emitting element are not adversely affected. Therefore, it is possible to improve not only the yield of a light-emitting element but also the yield of a light-emitting device and a lighting device each including the light-emitting element.

BRIEF DESCRIPTION OF THE DRAWINGS

FIGS. 5A and 5B illustrate a light-emitting device.

DETAILED DESCRIPTION OF THE INVENTION

Figure 1A:
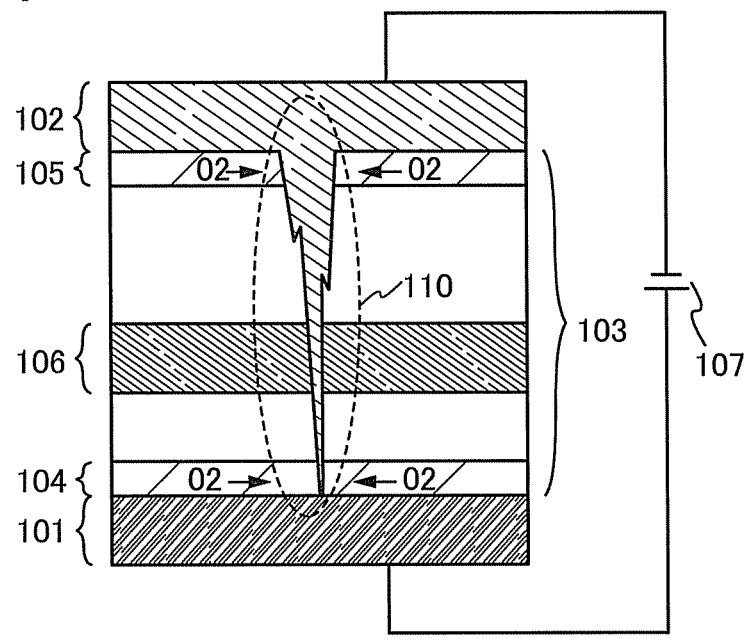
FIGS. 1A and 1B illustrate a light-emitting element according to an embodiment of the present invention.

Hereinafter, embodiments of the present invention will be described in detail with reference to the drawings. Note that the present invention is not limited to the following description, and modes and details thereof can be modified in various ways without departing from the spirit and the scope of the present invention. Therefore, the present invention should not be construed as being limited to the description in the following embodiments. In addition, components denoted by the same reference numerals throughout the drawings are considered as the same components, and repeated description thereof is omitted.

(Embodiment 1)

In this embodiment, a structure of a light-emitting element according to an embodiment of the present invention will be described with reference to FIGS. 1A and 1B and FIGS. 2A and 2B.

As illustrated in FIG. 1A, in the light-emitting element described in this embodiment, an EL layer 103 including at least a light-emitting layer 106 is interposed between a pair of electrodes (a first electrode (anode) 101 and a second electrode (cathode) 102), a first oxide layer 104 is formed between the first electrode 101 and the light-emitting layer 106 to be in contact with the first electrode 101, and a second oxide layer 105 is formed between the second electrode 102 and the light-emitting layer 106 to be in contact with the second electrode 102. Note that the pair of electrodes (the first electrode (anode) 101 and the second electrode (cathode) 102) of the light-emitting element are electrically connected to an external power supply 107.

FIG. 1A illustrates a situation where a defect is caused in the light-emitting element and a short circuit occurs between the first electrode 101 and the second electrode 102 in a region denoted by reference numeral 110.

At this time, in the light-emitting element according to an embodiment of the present invention, current flows in a concentrated manner in the short-circuited part, so that the part is locally heated to a high temperature. Therefore, oxygen in the oxide layers (the first oxide layer 104 and the second oxide layer 105) and an electrode material in the short-circuited part can be intentionally reacted with each other.

Figure 1B:
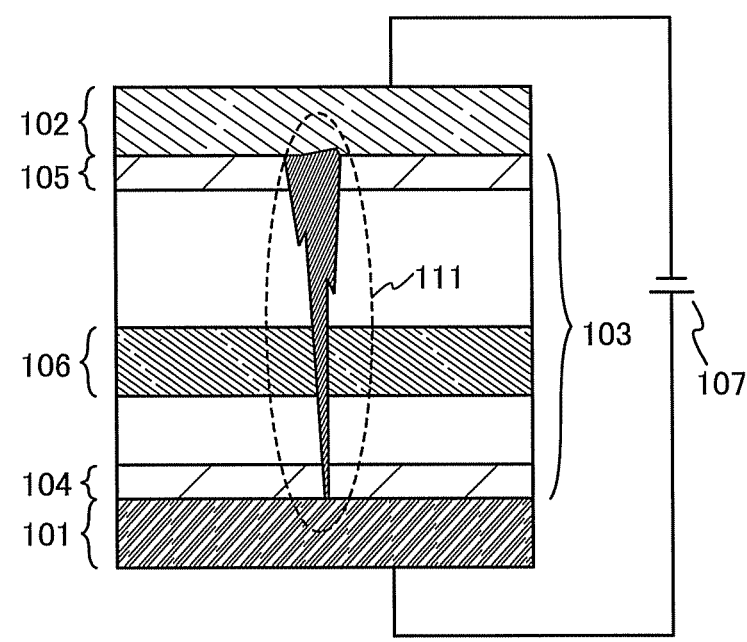

Accordingly, as illustrated in FIG. 1B, the electrode material in the short-circuited part can be an insulator as in a region denoted by reference numeral 111.

Figure 2A:
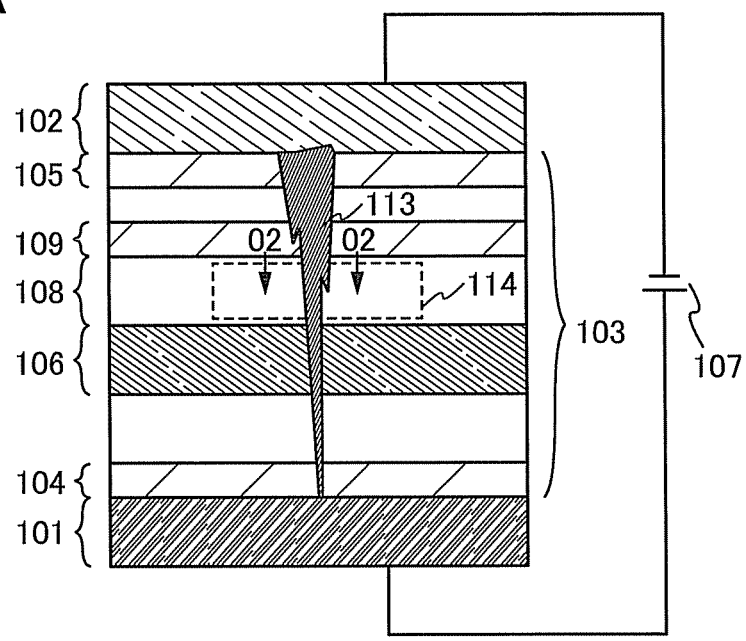
FIGS. 2A and 2B illustrate a light-emitting element according to an embodiment of the present invention.

With the above process, an insulator 113 is produced as illustrated in FIG. 2A owing to an insulation phenomenon in the short-circuited part. The insulator 113 has a space therein, so that moisture is likely to enter the insulator 113. Thus, it is not preferable that the insulator 113 exist as it is in the EL layer 103 in which deterioration would be accelerated by moisture.

Therefore, a structure in which moisture that enters the insulator 113 can be removed (adsorbed) is preferably employed. Specifically, as illustrated in FIG. 2A, a third oxide layer 109 is preferably provided in contact with an electron-injection layer 108.

Figure 2B:
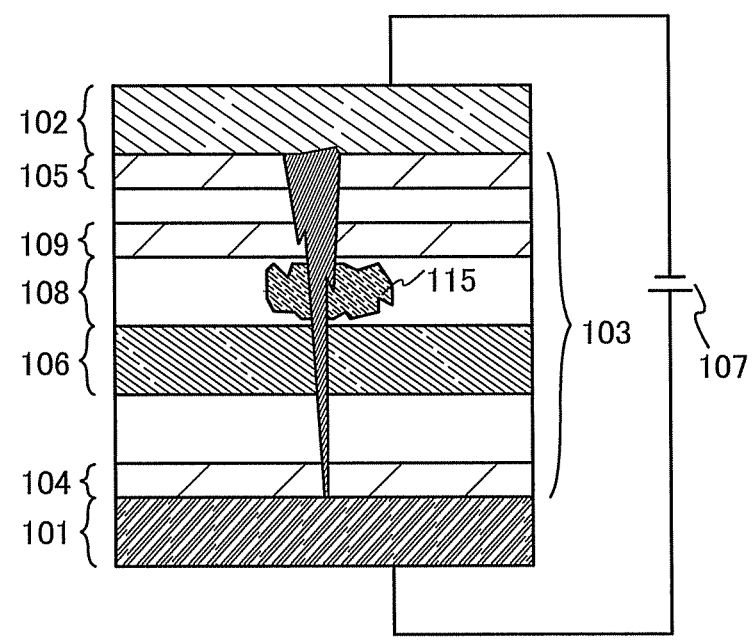

The electron-injection layer 108 in the EL layer 103 is formed using a substance having at least a high electron-injection property. When magnesium (Mg) or an alkaline earth metal such as calcium (Ca) is used as the substance having a high electron-injection property, oxygen in the oxide layer and the alkaline earth metal in the electron-injection layer are reacted with each other in a region denoted by reference numeral 114 in FIG. 2A owing to a high-temperature heat at the short-circuited part, whereby an oxide of the alkaline earth metal can be formed. A metal oxide 115 obtained as illustrated in FIG. 2B functions as a desiccating agent against moisture that may enter the insulator 113.

As described above, the light-emitting element according to an embodiment of the present invention has a function of recovering from a short circuit caused between the pair of electrodes by itself and a function of removing moisture which might enter the EL layer when the element recovers from a short circuit.

Accordingly, it is possible to provide a light-emitting element which has a self-recovery function with which an electrode material in a short-circuited part can be an insulator when a short circuit is caused between a pair of electrodes, where the characteristics of the light-emitting element are not adversely affected. Further, not only the yield of the light-emitting element but also the yield of a light-emitting device and a lighting device each including the light-emitting element can be improved.

Note that the structure described in this embodiment can be combined as appropriate with any of the structures described in the other embodiments.

(Embodiment 2)

In this embodiment, a structure of a light-emitting element according to an embodiment of the present invention will be described with reference to FIGS. 3A and 3B.

Figure 3A:
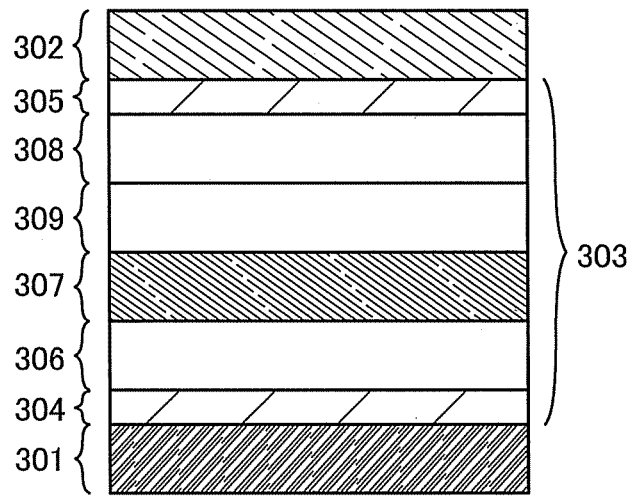
FIGS. 3A and 3B each illustrate a structure of a light-emitting element.

In the light-emitting element described in this embodiment, as illustrated in FIG. 3A, an EL layer 303 including a light-emitting layer 307 is interposed between a pair of electrodes (a first electrode (anode) 301 and a second electrode (cathode) 302). The EL layer 303 includes, as well as the light-emitting layer 307, a first oxide layer 304, a second oxide layer 305, a hole-injection layer 306, a charge-generation layer 308, and an electron-injection layer 309.

The first oxide layer 304 is formed in contact with the first electrode 301, and the second oxide layer 305 is formed in contact with the second electrode 302.

The hole-injection layer 306 is formed between the light-emitting layer 307 and the first oxide layer 304, and the first oxide layer 304 and the first electrode 301 are preferably formed in contact with each other.

Further, the charge-generation layer 308 and the electron-injection layer 309 are formed between the light-emitting layer 307 and the second oxide layer 305, and the second oxide layer 305 and the second electrode 302 are preferably formed in contact with each other.

The first oxide layer 304 and the second oxide layer 305 have a function of, when a short circuit is caused between the first electrode (anode) 301 and, the second electrode (cathode) 302, supplying oxygen to an electrode material (metal) in the short-circuited part, so that the electrode material is oxidized and becomes an insulator.

The hole-injection layer 306 is a layer containing a substance having a high hole-transport property and an acceptor substance. When electrons are extracted from the substance having a high hole-transport property owing to the acceptor substance, holes are generated. Therefore, holes are injected from the hole-injection layer 306 to the light-emitting layer 307.

The charge-generation layer 308 is a layer containing a substance having a high hole-transport property and an acceptor substance. Electrons are extracted from the substance having a high hole-transport property owing to the acceptor substance. Electrons are injected from the electron-injection layer 309 having an electron-injection property to the light-emitting layer 307.

A specific example in which the light-emitting element described in this embodiment is manufactured is described.

As the first electrode (anode) 301 and the second electrode (cathode) 302, a metal, an alloy, an electrically conductive compound, a mixture thereof, and the like can be used. Specifically, indium tin oxide (ITO), indium tin oxide containing silicon or silicon oxide, indium zinc oxide, indium oxide containing tungsten oxide and zinc oxide, gold (Au), platinum (Pt), nickel (Ni), tungsten (W), chromium (Cr), molybdenum (Mo), iron (Fe), cobalt (Co), copper (Cu), palladium (Pd), and titanium (Ti) can be used. In addition, an element belonging to Group 1 or Group 2 of the periodic table, for example, an alkali metal such as lithium (Li) or cesium (Cs), an alkaline earth metal such as calcium (Ca) or strontium (Sr), magnesium (Mg), an alloy containing such an element (MgAg, AlLi), a rare earth metal such as europium (Eu) or ytterbium (Yb), an alloy containing such an element, and the like can be used.

As a substance used for the first oxide layer 304 and the second oxide layer 305, a transition metal oxide or an oxide of a metal belonging to any of Group 4 to Group 8 of the periodic table can be given. The metal belonging to any of Group 4 to Group 8 of the periodic table can be an oxide whose oxidation number is large, which can be easily reduced by energy such as heat to an oxide whose oxidation number is small. Therefore, by using such a substance for the first oxide layer 304 and the second oxide layer 305, an electrode material in the short-circuited part can be easily oxidized when a short circuit occurs.

Specifically, when molybdenum oxide is reduced (when $MoO_3$ is reduced to $MoO_2$), oxygen can be supplied to the electrode material. In addition, also when vanadium oxide, rhenium oxide, or titanium oxide is reduced (when $V_2O_5$ is reduced to $VO_2$, $Re_2O_7$ is reduced to $ReO_3$, or $TiO_2$ is reduced to TiO), oxygen can be supplied to the electrode material.

Provided that an oxide of a metal belonging to any of Group 4 to Group 8 of the periodic table is $M_xO_y$, a metal whose oxidation number is the smallest among metals belonging to any of Group 4 to Group 8 is a divalent metal, that is, MO which satisfies x=y=1. It is difficult to further reduce an oxide denoted by MO (such as TiO or FeO); thus, the concentration of oxygen in each of the first oxide layer 304 and the second oxide layer 305 is preferably higher than or equal to 50 at. %. In addition, a metal whose oxidation number is the largest is rhenium oxide ($Re_2O_7$) (septivalent) and the concentration of oxygen therein is substantially 78 at. %. Accordingly, the concentration of oxygen in each of the first oxide layer 304 and the second oxide layer 305 is preferably lower than or equal to 80 at. %.

As the substance having a high hole-transport property used for the hole-injection layer 306 and the charge-generation layer 308, the following can be given, for example: aromatic amine compounds such as 4,4'-bis[N-(1-naphthyl)-N-phenylamino]biphenyl (abbreviation: NPB or α-NPD), NN-bis(3-methylphenyl)-N,N-diphenyl-[1,1'-biphenyl]-4,4'-diamine (abbreviation: TPD), 4,4',4''-tris(carbazol-9-yl)triphenylamine (abbreviation: TCTA), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), and 4,4'-bis[N-(spiro-9,9'-bifluoren-2-yl)-N-phenylamino]biphenyl (abbreviation: BSPB); 3-[N-(9-phenylcarbazol-3-yl)-N.-phenylamino]-9-phenyl-carbazole (abbreviation: PCzPCA1); 3,6-bis[N-(9-phenyl-carbazol-3-yl)-N-phenylamino]-9-phenylcarbazole (abbreviation: PCzPCA2); 3-[N-(1-naphthyl)-N-(9-phenylcarbazol-3-yl)amino]-9-phenylcarbazole (abbreviation: PCzPCN1); and the like. In addition, the following carbazole derivatives and the like can be used: 4,4'-di(N-carbazolyl)biphenyl (abbreviation: CBP), 1,3,5-tris[4-(N-carbazolyl)phenyl]benzene (abbreviation: TCPB), and 9-[4-(10-phenyl-9-anthracenyl)phenyl]-9H-carbazole (abbreviation: CzPA). The substances mentioned here are mainly ones that have a hole mobility of higher than or equal to $10^{-6}$ cm$^2$/Vs. However, substances other than the above-described ones may also be used as long as the substances have higher hole-transport properties than electron-transport properties.

Further, a high molecular compound such as poly(N-vinylcarbazole) (abbreviation: PVK), poly(4-vinyltriphenylamine) (abbreviation: PVTPA), poly[N-(4-{N'-[4-(4-(4-diphenylamino)phenyl]phenyl-N'-phenylamino}phenyl) methacryla mide] (abbreviation: PTPDMA), or poly[N,N'-bis(4-butylphenyl)-N,N'-bis(phenyl)benzidine] (abbreviation: Poly-TPD) can be used.

As examples of the acceptor substance that is used for the hole-injection layer 306 and the charge-generation layer 308, a transition metal oxide or an oxide of a metal belonging to any of Group 4 to Group 8 of the periodic table can be given.

Specifically, molybdenum oxide is particularly preferable. Note that the substance used here corresponds to the substance used for the first oxide layer 304 and the second oxide layer 305.

The light-emitting layer 307 is a layer containing a light-emitting substance. As the light-emitting substance, any of the following fluorescent compounds can be used: N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-antryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazole-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N''-(2-tert-butylanthracene-9,10-diyldi-4,1-phenylene)bis[N,N,N-triphenyl-1,4-phen ylenediamine] (abbreviation: DPABPA), N,9-diphenyl-N-[4-(9,10-diphenyl-2-anthryl)phenyl]-9H-carbazole-3-amine (abbreviation: 2PCAPPA), N-[4-(9,10-diphenyl-2-anthryl)phenyl]-N,N,N-triphenyl-1,4-phenylenediamine (abbreviation: 2DPAPPA), N,N,N',N',N'',N'',N''',N'''-octaphenyldibenzo[g,p] chrysene-2,7,10,15-tetraamine (abbreviation: DBC1), coumarin 30, N-(9,10-diphenyl-2-anthryl)-N,9-diphenyl-9H-carbazole-3-amine (abbreviation: 2PCAPA), N-[9,10-bis(1,1'-biphenyl-2-yl)-2-anthryl]-N,9-diphenyl-9H-carbazole-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N''-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracene-2-ami ne (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinit rile (abbreviation: DCM1), 2-{2-methyl-6-[2-(2,3,6,7-tetrahydro-1H,5H-benzo[ij]quinolizin-9-yl)ethenyl]-4H-pyra n-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-d iamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl) ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinoli zin-9-yl)ethenyl]-4H-pyran-4-ylidene}propanedinitrile (abbreviation: BisDCJTM), and the like.

As the light-emitting substance, any of the following phosphorescent compounds can also be used, for example: bis[2-(4',6'-difluorophenyl)pyridinato-N,$C^{2'}$]iridium(III) tetrakis(1-pyrazolyl)borate (abbreviation: FIr6), bis[2-(4',6'-difluorophenyl)pyridinato-N,$C^{2'}$]iridium(III)picolinate (abbreviation: FIrpic), bis[2-(3',5'-bistrifluoromethylphenyl)pyridinato-N,$C^{2'}$]iridium(III)picolinate (abbreviation: Ir(CF$_3$ppy)$_2$(pic)), bis[2-(4',6'-difluorophenyl)pyridinato-N,$C^{2'}$]iridium(III)acetylacetonate (abbreviation: FIracac), tris(2-phenylpyridinato)iridium(III) (abbreviation: Ir(ppy)$_3$), bis(2-phenylpyridinato)iridium(III)acetylacetonate (abbreviation: Ir(ppy)$_2$(acac)), bis(benzo[h]quinolinato)iridium(III)acetylacetonate (abbreviation: Ir(bzq)$_2$(acac)), bis(2,4-diphenyl-1,3-oxazolato-N,$C^{2'}$)iridium(III)acetylacetonate (abbreviation: Ir(dpo)$_2$(acac)), bis[2-(4-perfluorophenylphenyl)pyridinato]iridium(III)acetylacetonate (abbreviation: Ir(p-PF-ph)$_2$(acac)), bis(2-phenylbenzothiazolato-N,$C^{2'}$)iridium(III)acetylacetonate (abbreviation: Ir(bt)$_2$(acac)), bis[2-(2'-benzo[4,5-α]thienyl)pyridinato-N, $C^{3'}$]iridium(III)acetylacetonate (abbreviation: Ir(btp)$_2$(acac)), bis(1-phenylisoquinolinato-N,$C^{2'}$)iridium(III)acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), (acetylacetonato)bis(2,3,5-triphenylpyrazinato)iridium(III) (abbreviation: Ir(tppr)$_2$(acac)), 2,3,7,8,12,13,17,18-octaethyl-21H,23H-porphyrin platinum(II) (abbreviation: PtOEP), tris(acetylacetonato)(monophenanthroline)terbium(III) (abbreviation: Tb(acac)$_3$(Phen)), tris(1,3-diphenyl-1,3-propanedionato)(monophenanthroline)europium(III) (abbreviation: Eu(DBM)$_3$(Phen)), tris[1-(2-thenoyl)-3,3,3-trifluoroacetonato](monophenanthroline)europium(III) (abbreviation: Eu(TTA)$_3$(Phen)), and the like.

Note that those light-emitting substances are preferably dispersed in a host material. As the host material, for example, the following can be used: an aromatic amine compound such as NPB (abbreviation), TPD (abbreviation), TCTA (abbreviation), TDATA (abbreviation), MTDATA (abbreviation), or BSPB (abbreviation); a carbazole derivative such as PCzPCA1 (abbreviation), PCzPCA2 (abbreviation), PCzPCN1 (abbreviation), CBP (abbreviation), TCPB (abbreviation), or CzPA (abbreviation); a substance having a high hole-transport property which contains a high molecular compound, such as PVK (abbreviation), PVTPA (abbreviation), PTPDMA (abbreviation), or Poly-TPD (abbreviation); a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]-quinolinato)beryllium (abbreviation: BeBq$_2$), or bis(2-methyl-8-quinolinolato)(4-phenylphenolato)aluminum (abbreviation: BAlq); a metal complex having an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$); a substance having a high electron-transport property, such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]carbazole (abbreviation: CO11), 3-(4-biphenylyl)-4-phenyl-5-(4-tert-butylphenyl)-1,2,4-triazole (abbreviation: TAZ), bathophenanthroline (abbreviation: BPhen), or bathocuproine (abbreviation: BCP); and the like.

The electron-injection layer 309 is formed using a substance having at least a high electron-injection property. Besides, a substance having a high electron-transport property can be used to form the electron-injection layer 309.

As the substance having a high electron-injection property, the following can be given: an alkali metal such as lithium (Li) or cesium (Cs); an alkaline earth metal such as calcium (Ca) or strontium (Sr); magnesium (Mg); a rare earth metal such as europium (Eu) or ytterbium (Yb); an alkali metal compound (e.g., an oxide such as lithium oxide, a halide, or a carbonate such as lithium carbonate or cesium carbonate); an alkaline earth metal compound (e.g., an oxide, a halide, or a carbonate); a rare earth metal compound (e.g., an oxide, a halide, or a carbonate); and the like. A substance having an electron-transport property and containing any of the above substances or the like can also be used as the substance having a high electron-injection property.

In addition, as the substance having a high electron-transport property, for example, a metal complex having a quinoline skeleton or a benzoquinoline skeleton, such as Alq (abbreviation), Almq$_3$ (abbreviation), BeBq$_2$ (abbreviation), or BAlq (abbreviation) can be used. In addition to the above, a metal complex having an oxazole-based or thiazole-based ligand, such as Zn(BOX)$_2$ (abbreviation) or Zn(BTZ)$_2$ (abbreviation) or the like can be used. Furthermore, in addition to the above metal complexes, PBD (abbreviation), OXD-7 (abbreviation), CO11 (abbreviation), TAZ (abbreviation), BPhen (abbreviation), BCP (abbreviation), or the like can be used. Besides the above-described substances, a high molecular compound such as poly[(9,9-dihexylfluorene-2,7-diyl)-co-(pyridine-3,5-diyl)] (abbreviation: PF-Py) or poly[(9,9-dioctylfluorene-2,7-diyl)-co-(2,2'-bipyridine-6,6'-diyl)] (abbreviation: PF-BPy) can be used. The substances mentioned here are mainly ones that have an electron mobility of higher than or equal to $10^{-6}$ cm$^2$/Vs. Note that substances other than the above-described ones may also be used as long as the substances have higher electron-transport properties than hole-transport properties.

Figure 3B:
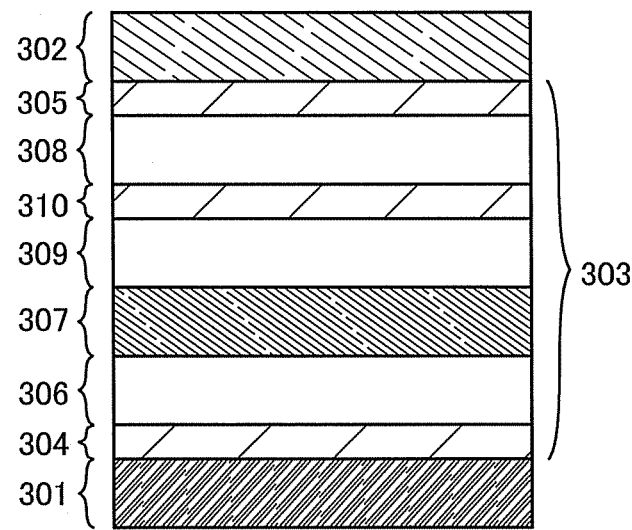

FIG. 3B illustrates an example of a light-emitting element having a structure different from that in FIG. 3A.

The light-emitting element illustrated in FIG. 3B includes a third oxide layer 310 between the charge-generation layer 308 and the electron-injection layer 309 in addition to the structure of the light-emitting element illustrated in FIG. 3A.

That is, by providing not only the oxide layers formed in contact with both the electrodes but also the third oxide layer 310 formed in contact with the electron-injection layer 309, moisture that enters an insulator formed in the short-circuited part as described in Embodiment 1 with reference to FIGS. 2A and 2B can be adsorbed and removed.

The third oxide layer 310 can be formed using a substance and a condition similar to those for the first oxide layer 304 and the second oxide layer 305.

As described above, it is possible to provide a light-emitting element having a self-recovery function with which an electrode material in a short-circuited part can be an insulator when a short circuit is caused between a pair of electrodes, where the characteristics of the light-emitting element are not adversely affected. Therefore, it is possible to improve not only the yield of a light-emitting element but also the yield of a light-emitting device and a lighting device each including the light-emitting element.

Note that the structure described in this embodiment can be combined as appropriate with any of the structures described in the other embodiments.

(Embodiment 3)

In this embodiment, as a structure of a light-emitting element according to an embodiment of the present invention, an example of a structure in which a plurality of EL layers are stacked between a pair of electrodes (a so-called tandem structure) will be described with reference FIGS. 4A and 4B.

Figure 4A:
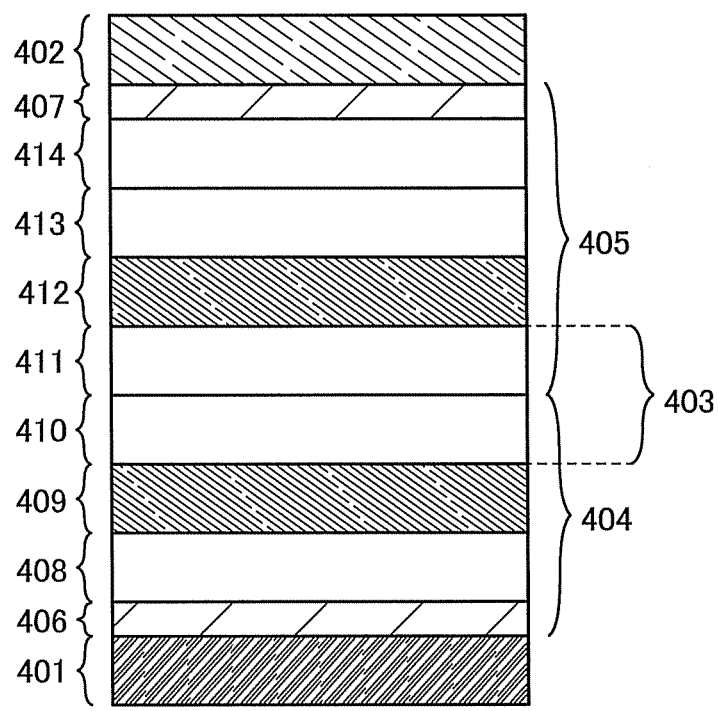
FIGS. 4A and 4B each illustrate a structure of a light-emitting element.

The light-emitting element described in this embodiment includes, as illustrated in FIG. 4A, an intermediate layer 403 between a pair of electrodes (a first electrode (anode) 401 and a second electrode (cathode) 402); a first EL layer 404 including a first oxide layer 406, a first hole-injection layer 408, a first light-emitting layer 409, and a first electron-injection layer 410 between the first electrode 401 and the intermediate layer 403; and a second EL layer 405 including a second hole-injection layer 411, a second light-emitting layer 412, a second electron-injection layer 413, and a second oxide layer 407 between the second electrode 402 and the intermediate layer 403. The intermediate layer 403 includes the first electron-injection layer 410 included in the first EL layer 404 and the second hole-injection layer 411 included in the second EL layer 405.

Further, it is preferable that the first oxide layer 406 be formed in contact with the first electrode 401 and the second oxide layer 407 be formed in contact with the second electrode 402.

The first oxide layer 406 and the second oxide layer 407 have a function of, when a short circuit is caused between the first electrode (anode) 401 and the second electrode (cathode) 402, supplying oxygen to an electrode material (metal) in the short-circuited part, so that the electrode material is oxidized and becomes an insulator.

Each of the first hole-injection layer 408 and the second hole-injection layer 411 is a layer containing a substance having a high hole-transport property and an acceptor substance. When electrons are extracted from the substance having a high hole-transport property owing to the acceptor substance, holes are generated. Therefore, holes are injected from the first hole-injection layer 408 to the first light-emitting layer 409, and holes are injected from the second hole-injection layer 411 to the second light-emitting layer 412.

The first electron-injection layer 410 has an electron-injection property. Electrons extracted from the substance having a high hole-transport property owing to the acceptor substance in the second hole-injection layer 411 are injected to the first light-emitting layer 409.

A charge-generation layer 414 is a layer containing a substance having a high hole-transport property and an acceptor substance. Electrons are extracted from the substance having a high hole-transport property owing to the acceptor substance. Electrons are injected from the second electron-injection layer 413 having an electron-injection property to the second light-emitting layer 412.

The intermediate layer 403 has a function of injecting holes to the second light-emitting layer 412 and injecting electrons to the first light-emitting layer 409. Specifically, holes generated by extracting electrons from the substance having a high hole-transport property owing to the acceptor substance in the second hole-injection layer 411 are injected to the second light-emitting layer 412, and the extracted electrons are injected from the first electron-injection layer 410 having an electron-injection property to the first light-emitting layer 409.

In the light-emitting element having the structure as described above, the first electrode 401 and the second electrode 402 can be formed in a manner similar to those of the first electrode 301 and the second electrode 302 described in Embodiment 2. The first light-emitting layer 409 and the second light-emitting layer 412 can be formed in a manner similar to that of the light-emitting layer 307 described in Embodiment 2. The first oxide layer 406 and the second oxide layer 407 can be formed in a manner similar to those of the first oxide layer 304 and the second oxide layer 305 described in Embodiment 2. The first hole-injection layer 408 and the second hole-injection layer 411 can be formed in a manner similar to that of the hole-injection layer 306 described in Embodiment 2. The charge-generation layer 414 can be formed in a manner similar to that of the charge-generation layer 308 described in Embodiment 2. The first electron-injection layer 410 and the second electron-injection layer 413 can be formed in a manner similar to that of the electron-injection layer 309 described in Embodiment 2.

Figure 4B:
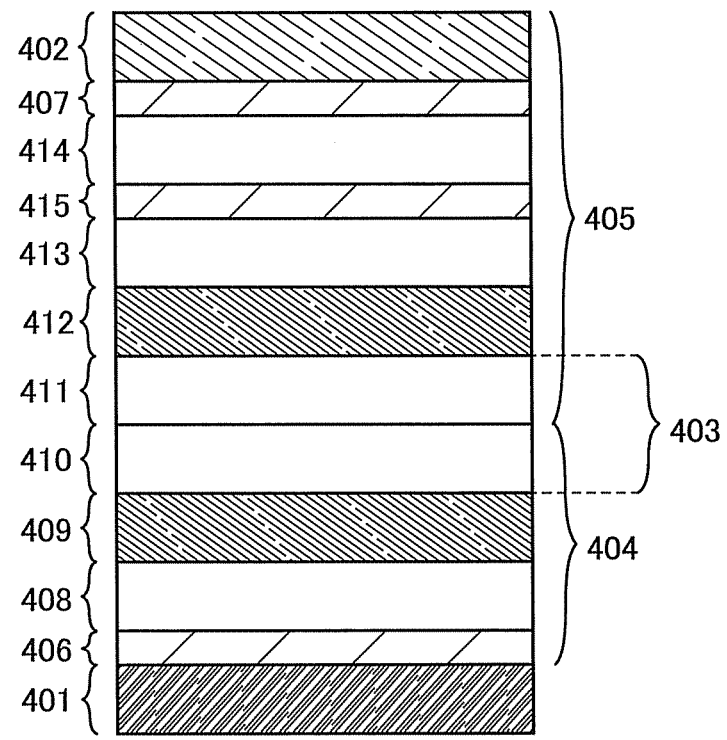

FIG. 4B illustrates an example of a light-emitting element having a structure different from that in FIG. 4A.

The light-emitting element illustrated in FIG. 4B includes a third oxide layer 415 between the charge-generation layer 414 and the second electron-injection layer 413 in addition to the structure of the light-emitting element illustrated in FIG. 4A.

That is, by providing not only the oxide layers formed in contact with both the electrodes but also the third oxide layer 415 formed in contact with the second electron-injection layer 413, moisture that enters an insulator formed in the short-circuited part as described in Embodiment 1 with reference to FIGS. 2A and 2B can be adsorbed and removed.

The third oxide layer 415 can be formed using a substance and a condition similar to those for the first oxide layer 406 and the second oxide layer 407.

As described above, it is possible to provide a light-emitting element having a self-recovery function with which an electrode material in a short-circuited part can be an insulator when a short circuit is caused between a pair of electrodes, where the characteristics of the light-emitting element are not adversely affected. Therefore, it is possible to improve not only the yield of a light-emitting element but also the yield of a light-emitting device and a lighting device each including the light-emitting element.

The structure in which two EL layers are formed between the pair of electrodes is described as an example of a light-emitting element having a tandem structure in this embodiment; the present invention is not limited thereto. For example, between the first oxide layer 406 and the first hole-injection layer 408 illustrated in FIGS. 4A and 4B, a plurality of EL layers in each of which at least a hole-injection layer, a light-emitting layer, and an electron-injection layer are sequentially stacked can be provided such that the hole-injection layer is placed on the first oxide layer 406 side.

As described above, it is possible to provide a light-emitting element having a self-recovery function with which an electrode material in a short-circuited part can be an insulator when a short circuit is caused between a pair of electrodes, where the characteristics of the light-emitting element are not adversely affected. Therefore, it is possible to improve not only the yield of a light-emitting element but also the yield of a light-emitting device and a lighting device each including the light-emitting element.

Note that the structure described in this embodiment can be combined as appropriate with any of the structures described in the other embodiments.

(Embodiment 4)

In Embodiment 4, a light-emitting device including a light-emitting element according to an embodiment of the present invention in a pixel portion will be described with reference to FIGS. 5A and 5B. FIG. 5A is a top view of the light-emitting device, and FIG. 5B is a cross-sectional view taken along lines A-A' and B-B' of FIG. 5A.

In FIG. 5A, reference numeral 501 indicated by a dashed line denotes a driver circuit portion (a source side driver circuit); 502, a pixel portion; and 503, a driver circuit portion (a gate side driver circuit). Reference numeral 504 denotes a sealing substrate; 505, a sealant; and a portion surrounded by the sealant 505, a space 507.

A lead wiring 508 is a wiring for transmitting a signal to be input to the source side driver circuit 501 and the gate side driver circuit 503 and receiving a video signal, a clock signal, a start signal, a reset signal, and the like from a flexible printed circuit (FPC) 509 serving as an external input terminal. Although only the FPC is illustrated here, a printed wiring board (PWB) may be attached to the FPC. A light-emitting device in this specification includes not only a light-emitting device itself but also a light-emitting device to which an FPC or a PWB is attached.

Next, a cross-sectional structure is explained with reference to FIG. 5B. Although the driver circuit portions and the pixel portion are formed over an element substrate 510, FIG. 5B illustrates the source side driver circuit 501 which is one of the driver circuit portions and one pixel in the pixel portion 502. As the source side driver circuit 501, a CMOS circuit in which an n-channel TFT 523 and a p-channel TFT 524 are combined is formed. Such a driver circuit may also be formed by using any of various circuits such as a CMOS circuit, a PMOS circuit, and an NMOS circuit. Although a driver-integrated type in which a driver circuit is formed over the substrate is described in this embodiment, the present invention is not limited thereto, and the driver circuit can be formed not over the substrate but outside the substrate.

The pixel portion 502 is formed with a plurality of pixels each including a switching TFT 511, a current control TFT 512, and a first electrode 513 which is electrically connected to a drain of the current control TFT 512. An insulator 514 is formed so as to cover an edge portion of the first electrode 513.

In addition, in order to obtain favorable coverage by a film which is to be stacked over the insulator 514, the insulator 514 is preferably formed so as to have a curved surface with curvature at an upper edge portion or a lower edge portion. For example, when positive type photosensitive acrylic is used as a material for the insulator 514, only an upper edge portion of the insulator 514 can have a curved surface with a radius of curvature (0.2 µm to 3 µm). Further, either a negative type photosensitive material which becomes insoluble in an etchant by light irradiation or a positive type photosensitive material which becomes soluble in an etchant by light irradiation can be used as the insulator 514.

An EL layer 516 and a second electrode 517 are formed over the first electrode 513. Here, as a material for forming the first electrode 513, a material having a high work function is preferably used. For example, it is possible to use a single layer of an ITO film, an indium tin oxide film containing silicon, an indium oxide film containing 2 wt % to 20 wt % of zinc oxide, a titanium nitride film, a chromium film, a tungsten film, a Zn film, a Pt film, or the like, a stacked layer of a titanium nitride film and a film that mainly contains aluminum, a three-layer structure of a titanium nitride film, a film that mainly contains aluminum, and a titanium nitride film, or the like. Note that when a stacked structure is employed, the resistance of a wiring is low and a favorable ohmic contact is obtained.

In addition, the EL layer 516 is formed by any of various methods such as an evaporation method using an evaporation mask, a droplet discharging method such as an inkjet method, a printing method, and a spin coating method. The EL layer 516 includes any of the oxadiazole derivatives described in Embodiment 1. Further, another material to form the EL layer 516 may be a low molecular material, an oligomer, a dendrimer, a high molecular material, or the like.

As a material for forming the second electrode 517, any of various metals, alloys, electrically conductive compounds, and mixture thereof can be used. If the second electrode 517 is used as a cathode, it is preferable that the second electrode 517 be formed using a metal, an alloy, an electrically conductive compound, a mixture thereof, or the like with a low work function (preferably, a work function of lower than or equal to 3.8 eV) among such materials. As an example, an element belonging to Group 1 or Group 2 of the periodic table, i.e., an alkali metal such as lithium (Li) or cesium (Cs), an alkaline earth metal such as calcium (Ca) or strontium (Sr), magnesium (Mg), an alloy containing such an element (MgAg, AlLi), and the like can be given.

Note that in the case where light generated in the EL layer 516 is transmitted through the second electrode 517, for the second electrode 517, a stack of a metal thin film with a reduced thickness and a transparent conductive film (indium tin oxide (ITO), indium tin oxide containing silicon or silicon oxide, indium zinc oxide, or indium oxide containing tungsten oxide and zinc oxide, or the like) can be used.

A structure provided with a light-emitting element 518 in the space 507 which is surrounded by the element substrate 510, the sealing substrate 504, and the sealant 505 is formed by attaching the sealing substrate 504 to the element substrate 510 with the sealant 505. Note that the space 507 is filled with a filler. There are cases where the space 507 may be filled with an inert gas (such as nitrogen or argon) and where the space 507 may be filled with the sealant 505.

An epoxy-based resin is preferably used for the sealant 505. A material used for such components is desirably a material which does not transmit moisture or oxygen as much as possible. As the sealing substrate 504, a glass substrate, a quartz substrate, or a plastic substrate formed of fiberglass reinforced plastic (FRP), polyvinyl fluoride (PVF), polyester, acrylic, or the like can be used.

In the above manner, an active matrix light-emitting device including a light-emitting element according to an embodiment of the present invention can be obtained. Further, the light-emitting element according to an embodiment of the present invention can be used for a passive matrix light-emitting device as well as the active matrix light-emitting device. Since the light-emitting element according to an embodiment of the present invention is a light-emitting element having a self-recovery function with which an electrode material in a short-circuited part can be an insulator when a short circuit is caused between a pair of electrodes, the yield of the light-emitting device can be improved.

Note that the structure described in this embodiment can be combined as appropriate with any of the structures described in the other embodiments.

(Embodiment 5)

Figure 6A:
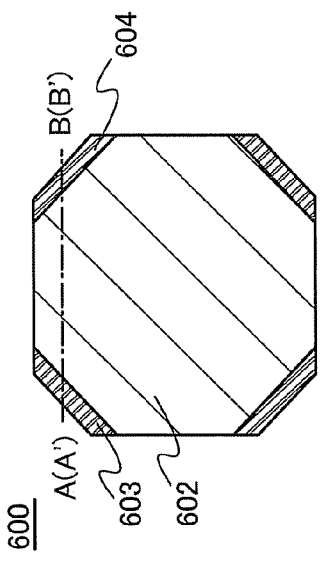
FIGS. 6A to 6C each illustrate a light-emitting device.

In this embodiment, a light-emitting device which includes a light-emitting element according to an embodiment of the present invention and can be used mainly for a lighting device will be described with reference to FIGS. 6A to 6C. FIG. 6A is a top view illustrating a light-emitting device 600, and FIG. 6B is a cross-sectional view along line A-B of FIG. 6A.

The light-emitting device 600 illustrated in FIG. 6A has a structure in which a light-emitting element is formed over a light-emitting surface and one electrode of the light-emitting element is electrically connected to a first terminal 603 and the other electrode of the light-emitting element is electrically connected to a second terminal 604.

Figure 6B:
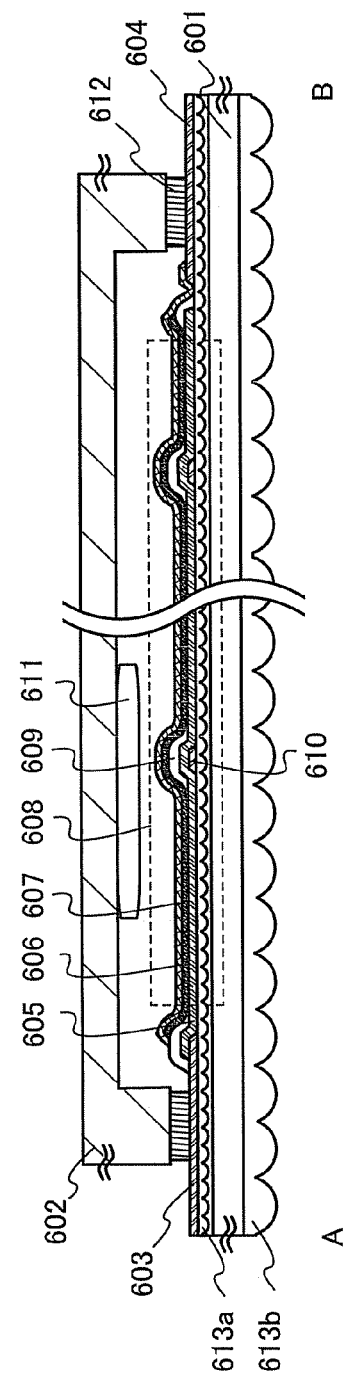

The light-emitting device 600 illustrated in FIG. 6B includes, over a first substrate 601, a light-emitting element 608 including a first electrode 605, an EL layer 606, and a second electrode 607. A light-emitting element according to an embodiment of the present invention is used as the light-emitting element 608.

As illustrated in FIG. 6B, the first terminal 603 is electrically connected to an auxiliary wiring 610 and the first electrode 605. The second terminal 604 is electrically connected to the second electrode 607. An insulating layer 609 is formed over an edge portion of the first electrode 605 and the first electrode 605 in a region where the auxiliary wiring 610 is stacked. Note that although the first electrode 605 is formed over the auxiliary wiring 610 in FIG. 6B, the auxiliary wiring 610 may be formed over the first electrode 605.

The first substrate 601 and a second substrate 602 are bonded to each other with a sealant 612. A desiccant agent 611 is provided between the first substrate 601 and the second substrate 602.

A light extraction structure 613a with minute unevenness is provided between the light-emitting element with a high refractive index and the substrate with a lower refractive index, and a light extraction structure 613b with unevenness larger than that of the light extraction structure 613a is provided between the substrate and the air. Such a light extraction structure may be provided at a top portion of the first substrate 601, a bottom portion of the first substrate 601, or both thereof.

The light-emitting device illustrated in FIG. 6B has a so-called bottom emission structure in which light emitted from the light-emitting element 608 is extracted from the first electrode 605 side of the light-emitting element 608; however, the present invention is not limited thereto, and a light-emitting device having a top emission structure in which light is extracted from the second electrode 607 side of the light-emitting element 608 is also possible.

Figure 6C:
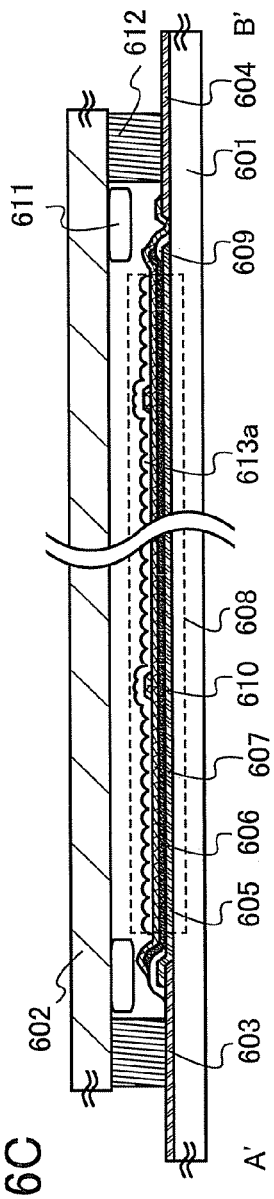

A structure as illustrated in FIG. 6C can be used for a top-emission light-emitting device. FIG. 6C is a cross-sectional view along A'-B' of FIG. 6A.

A light-emitting device 600 having a top emission structure includes, over a first substrate 601, a light-emitting element 608 including a first electrode 605, an EL layer 606, and a second electrode 607. A light-emitting element according to an embodiment of the present invention is used as the light-emitting element 608.

As illustrated in FIG. 6C, a first terminal 603 is electrically connected to the first electrode 605, and a second terminal 604 is electrically connected to the second electrode 607. Further, an insulating layer 609 is formed over an edge portion of the first electrode 605. An auxiliary wiring 610 is formed over the second electrode 607.

The first substrate 601 and a second substrate 602 are bonded to each other with a sealant 612. A desiccant agent 611 is provided between the first substrate 601 and the second substrate 602. The desiccant agent 611 is preferably provided so as not to overlap with the light-emitting element or is preferably transparent.

A light extraction structure 613a is provided over the light-emitting element 608.

Although the light-emitting device 600 illustrated in FIG. 6A has an octagonal shape, an embodiment of the present invention is not limited thereto. The light-emitting device 600 may have other polygonal shapes or a shape with a curve. In particular, as the shape of the light-emitting device 600, a triangular shape, a rectangular shape, a regular hexagonal shape, or the like is preferable. This is because a plurality of the light-emitting devices 600 can be provided without a redundant space in a limited area.

In the above manner, the light-emitting device including the light-emitting element according to an embodiment of the present invention can be obtained. Since the light-emitting element according to an embodiment of the present invention is a light-emitting element having a self-recovery function with which an electrode material in a short-circuited part can be an insulator when a short circuit is caused between a pair of electrodes, the yield of the light-emitting device can be improved.

Note that the structure described in this embodiment can be combined as appropriate with any of the structures described in the other embodiments.

(Embodiment 6)

In this embodiment, with reference to FIGS. 7A to 7D, examples of a variety of electronic devices that are completed by using the light-emitting device according to an embodiment of the present invention will be described.

Examples of the electronic devices to which the light-emitting device is applied are television devices (also referred to as TV or television receivers), monitors for computers and the like, cameras such as digital cameras or digital video cameras, digital photo frames, mobile phone sets (also referred to as mobile phones or mobile phone devices), portable game machines, portable information terminals, audio playback devices, large game machines such as pin-ball machines, and the like. Specific examples of these electronic devices are illustrated in FIGS. 7A to 7D.

Figure 7A:
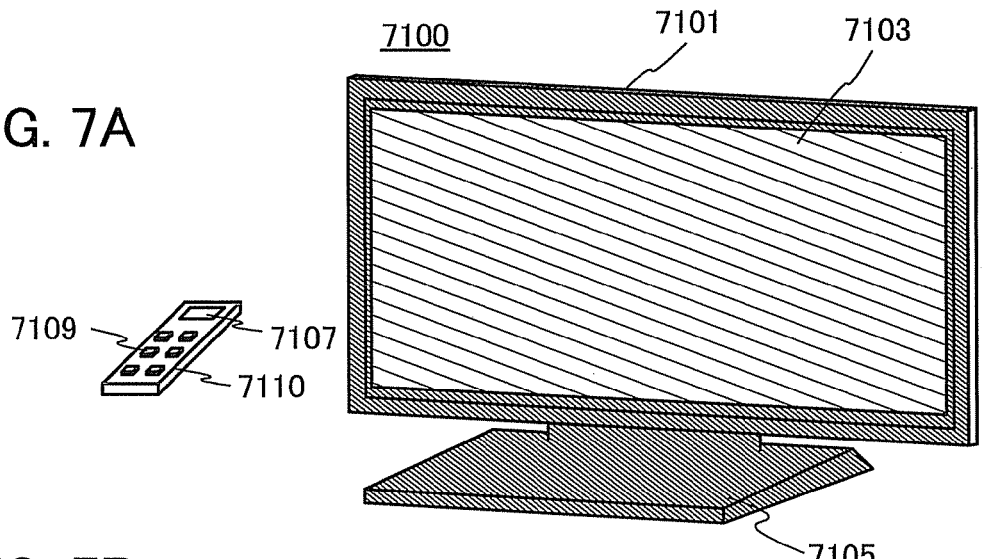
FIGS. 7A to 7D each illustrate an electronic device.

FIG. 7A illustrates an example of a television device. In a television device 7100, a display portion 7103 is incorporated in a housing 7101. Images can be displayed on the display portion 7103, and the light-emitting device can be used for the display portion 7103. In addition, here, the housing 7101 is supported by a stand 7105.

The television device 7100 can be operated by an operation switch of the housing 7101 or a separate remote controller 7110. With operation keys 7109 of the remote controller 7110, channels and volume can be controlled, and images displayed on the display portion 7103 can be controlled. Furthermore, the remote controller 7110 may be provided with a display portion 7107 for displaying data output from the remote controller 7110.

Note that the television device 7100 is provided with a receiver, a modem, and the like. With the receiver, a general television broadcast can be received. Furthermore, when the television device 7100 is connected to a communication network by wired or wireless connection via the modem, one-way (from a transmitter to a receiver) or two-way (between a transmitter and a receiver, between receivers, or the like) data communication can be performed.

Figure 7B:
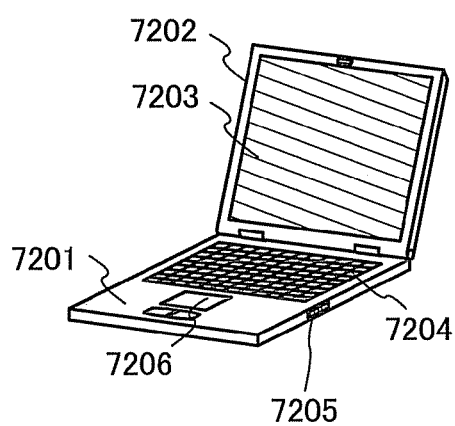

FIG. 7B illustrates a computer which includes a main body 7201, a housing 7202, a display portion 7203, a keyboard 7204, an external connecting port 7205, a pointing device 7206, and the like. This computer is manufactured by using the light-emitting device for the display portion 7203.

Figure 7C:
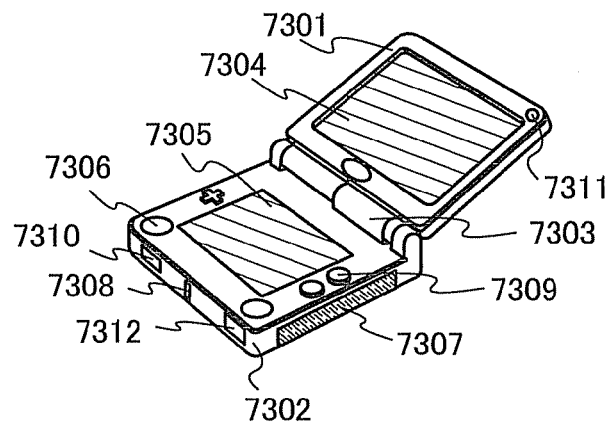

FIG. 7C illustrates a portable game machine which includes two housings, a housing 7301 and a housing 7302, which are connected with a joint portion 7303 so that the portable game machine can be opened or folded. A display portion 7304 is incorporated in the housing 7301, and a display portion 7305 is incorporated in the housing 7302. In addition, the portable game machine illustrated in FIG. 7C includes a speaker portion 7306, a recording medium insertion portion 7307, an LED lamp 7308, an input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), and a microphone 7312), and the like. It is needless to say that the structure of the portable game machine is not limited to the above as long as the light-emitting device is used for at least one of the display portion 7304 and the display portion 7305, and may include other accessories as appropriate. The portable game machine illustrated in FIG. 7C has a function of reading out a program or data stored in a recording medium to display it on the display portion, and a function of sharing data with another portable game machine by wireless communication. The portable game machine illustrated in FIG. 7C can have a variety of functions without limitation to the above.

Figure 7D:
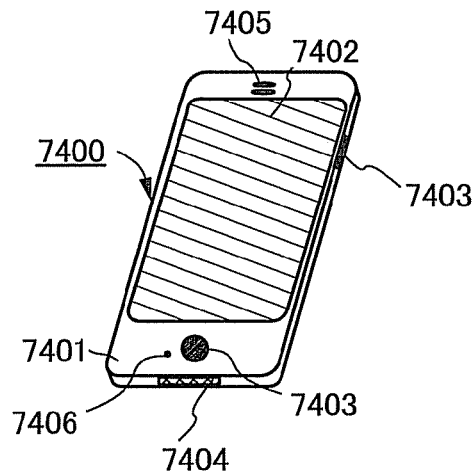

FIG. 7D illustrates an example of a mobile phone set. A mobile phone set 7400 is provided with a display portion 7402 incorporated in a housing 7401, operation buttons 7403, an external connection port 7404, a speaker 7405, a microphone 7406, and the like. Note that the mobile phone set 7400 is manufactured using the light-emitting device for the display portion 7402.

When the display portion 7402 of the mobile phone set 7400 illustrated in FIG. 7D is touched with a finger or the like, data can be input to the mobile phone set 7400. Further, operations such as making a call and composing an e-mail can be performed by touching the display portion 7402 with a finger or the like.

There are mainly three screen modes for the display portion 7402. The first mode is a display mode mainly for displaying images. The second mode is an input mode mainly for inputting data such as text. The third mode is a display-and-input mode in which two modes of the display mode and the input mode are combined.

For example, in the case of making a call or composing an e-mail, a text input mode mainly for inputting text is selected for the display portion 7402 so that text displayed on the screen can be input. In this case, it is preferable to display a keyboard or number buttons on almost the entire screen of the display portion 7402.

When a detection device including a sensor for detecting inclination, such as a gyroscope or an acceleration sensor, is provided inside the mobile phone set 7400, display on the screen of the display portion 7402 can be automatically changed by determining the orientation of the mobile phone set 7400 (whether the mobile phone set is placed horizontally or vertically for a landscape mode or a portrait mode).

The screen modes are switched by touching the display portion 7402 or operating the operation buttons 7403 of the housing 7401. Alternatively, the screen modes can be switched depending on kinds of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed for a specified period while a signal detected by an optical sensor in the display portion 7402 is detected, the screen mode may be controlled so as to be switched from the input mode to the display mode.

The display portion 7402 may function as an image sensor. For example, an image of a palm print, a fingerprint, or the like is taken by touching the display portion 7402 with a palm or a finger, whereby personal authentication can be performed. Further, by providing a backlight or a sensing light source which emits near-infrared light in the display portion, an image of a forger vein, a palm vein, or the like can be taken.

As described above, the electronic devices can be obtained by application of the light-emitting device according to an embodiment of the present invention. Application range of the light-emitting device is so broad that the light-emitting device can be applied to electronic devices in a variety of fields.

Note that the structure described in this embodiment can be combined as appropriate with any of the structures described in the other embodiments.

(Embodiment 7)

In this embodiment, examples of a lighting device according to an embodiment of the present invention will be described with reference to FIG. 8.

The lighting device described in this embodiment can be formed by using the light-emitting device including the light-emitting element according to an embodiment of the present invention which is described in Embodiment 4 or 5.

Figure 8:
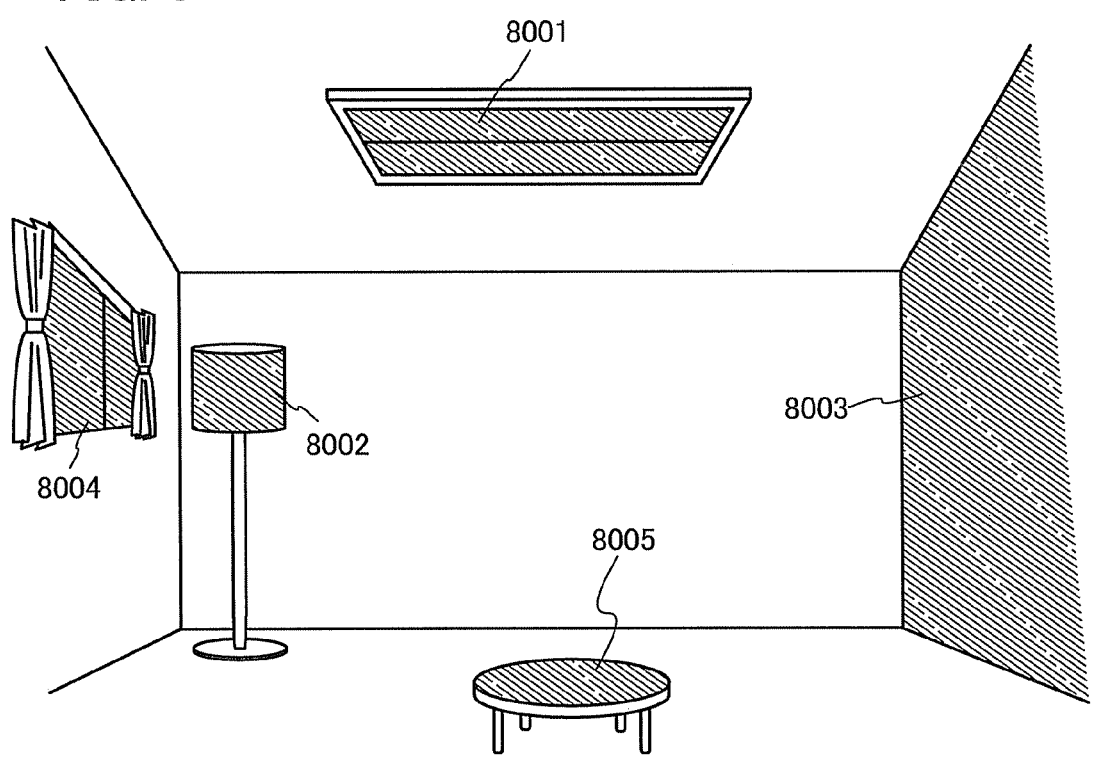
FIG. 8 illustrates lighting devices.

FIG. 8 illustrates an example of using the lighting device according to an embodiment of the present invention as an indoor lighting device 8001. Since the lighting device can have a larger area, it can be used as a lighting device having a large area. In addition, a lighting device 8002 in which a light-emitting region has a curved surface can also be obtained with the use of a housing with a curved surface. A light-emitting element included in the lighting device described in this embodiment is in a thin film form, which allows the housing to be designed more freely. Therefore, the lighting device can be elaborately designed in a variety of ways. Further, a wall of the room may be provided with a large-sized lighting device 8003.

The lighting device according to an embodiment of the present invention can also be used as a window glass 8004 by forming the lighting device with the use of only a light-transmitting material.

The lighting device according to an embodiment of the present invention can also be used as a table by using the light-emitting device as a surface of a table 8005. By using the light-emitting device as part of other furniture, the lighting device can be used as the furniture.

As described above, the lighting device according to an embodiment of the present invention can be used for various applications. Since the lighting device according to an embodiment of the present invention includes a light-emitting element having a self-recovery function with which an electrode material in a short-circuited part can be an insulator when a short circuit is caused between a pair of electrodes, the yield of the lighting device can be improved.

Note that the structure described in this embodiment can be combined as appropriate with any of the structures described in the other embodiments. This application is based on Japanese Patent Application serial no. 2011-027037 filed with Japan Patent Office on Feb. 10, 2011, the entire contents of which are hereby incorporated by reference.

What is claimed is:

1. A light-emitting device comprising:
a first electrode;
a second electrode;
a light-emitting layer between the first electrode and the second electrode;
a first oxide layer between the first electrode and the light-emitting layer, the first oxide layer being in contact with the first electrode;
a second oxide layer between the second electrode and the light-emitting layer, the second oxide layer being in contact with the second electrode;
an electron-injection layer between the second electrode and the light-emitting layer, the electron-injection layer being in contact with the light-emitting layer; and
a third oxide layer between the second electrode and the light-emitting layer, the third oxide layer being in contact with the electron-injection layer,
wherein the electron-injection layer is provided between the light emitting layer and the third oxide layer.

2. The light-emitting device according to claim 1, wherein each of the first oxide layer and the second oxide layer comprise a transition metal oxide or an oxide of a metal belonging to any of Group 4 to Group 8 of the periodic table.

3. The light-emitting device according to claim 1, wherein each of the first oxide layer and the second oxide layer comprise an oxide of a metal, the metal being selected from the group consisting of molybdenum, vanadium, rhenium, and titanium.

4. The light-emitting device according to claim 1, wherein a concentration of oxygen in each of the first oxide layer and the second oxide layer is higher than or equal to 50 at. % and lower than or equal to 80 at. %.

5. The light-emitting device according to claim 1, wherein the electron-injection layer comprises an alkaline earth metal.

6. A lighting device comprising the light-emitting device according to claim 1.

7. A light-emitting device comprising:
a first electrode;
a second electrode;
an intermediate layer between the first electrode and the second electrode;
a first light-emitting layer between the first electrode and the intermediate layer;
a second light-emitting layer between the second electrode and the intermediate layer;
a first oxide layer between the first electrode and the first light-emitting layer, the first oxide layer being in contact with the first electrode;
a second oxide layer between the second electrode and the second light-emitting layer, the second oxide layer being in contact with the second electrode;
an electron-injection layer between the second electrode and the second light-emitting layer, the electron-injection layer being in contact with the second light-emitting layer; and
a third oxide layer between the second electrode and the second light-emitting layer, the third oxide layer being in contact with the electron-injection layer,
wherein the electron-injection layer is provided between the second light emitting layer and the third oxide layer.

8. The light-emitting device according to claim 7, wherein each of the first oxide layer and the second oxide layer comprise a transition metal oxide or an oxide of a metal belonging to any of Group 4 to Group 8 of the periodic table.

9. The light-emitting device according to claim 7, wherein each of the first oxide layer and the second oxide layer comprise an oxide of a metal, the metal being selected from the group consisting of molybdenum, vanadium, rhenium, and titanium.

10. The light-emitting device according to claim 7, wherein a concentration of oxygen in each of the first oxide layer and the second oxide layer is higher than or equal to 50 at. % and lower than or equal to 80 at. %.

11. The light-emitting device according to claim 7, wherein the electron-injection layer comprises an alkaline earth metal.

12. A lighting device comprising the light-emitting device according to claim 7.

13. A light-emitting device comprising:
a first electrode;
a second electrode;
a light-emitting layer between the first electrode and the second electrode;
a first oxide layer between the first electrode and the light-emitting layer, the first oxide layer being in contact with the first electrode;
a second oxide layer between the second electrode and the light-emitting layer, the second oxide layer being in contact with the second electrode;

an electron-injection layer between the second electrode and the light-emitting layer, the electron-injection layer being in contact with the light-emitting layer; and a third oxide layer between the second electrode and the light-emitting layer, wherein the electron-injection layer is provided between the light emitting layer and the third oxide layer, and wherein at least one of the first oxide layer and the second oxide layer provides oxygen to an electrode material in a short-circuited part between the first electrode and the second electrode whereby the electrode material is oxidized to form an insulator.

14. The light-emitting device according to claim 13, wherein each of the first oxide layer and the second oxide layer comprise a transition metal oxide or an oxide of a metal belonging to any of Group 4 to Group 8 of the periodic table.

15. The light-emitting device according to claim 13, wherein each of the first oxide layer and the second oxide layer comprise an oxide of a metal, the metal being selected from the group consisting of molybdenum, vanadium, rhenium, and titanium.

16. The light-emitting device according to claim 13, wherein a concentration of oxygen in each of the first oxide layer and the second oxide layer is higher than or equal to 50 at. % and lower than or equal to 80 at. %.

17. The light-emitting device according to claim 13, wherein the electron-injection layer comprises an alkaline earth metal.

18. A lighting device comprising the light-emitting device according to claim 13.

* * * * *

UNITED STATES PATENT AND TRADEMARK OFFICE
CERTIFICATE OF CORRECTION

PATENT NO. : 8,895,996 B2
APPLICATION NO. : 13/368449
DATED : November 25, 2014
INVENTOR(S) : Shunpei Yamazaki and Satoshi Seo It is certified that error appears in the above-identified patent and that said Letters Patent is hereby corrected as shown below:

In the Specification:

Column 2, Line 47; Change "second,electrode," to --second electrode,--.

Column 2, Line 66; Change "layer," to --layer--.

Column 5, Line 30; Change "and, the" to --and the--.

Column 6, Line 35; Change "NN-bis" to --N,N'-bis--.

Column 6, Line 35; Change ")-N,N-diphenyl" to --)-N,N'-diphenyl--.

Column 6, Line 42; Change "N.-phenylamino" to --N-phenylamino--.

Column 6, Line 59 to 60; Change "[N-(4-{N'-[4-(4-(4-diphenylamino)" to --[N-(4-{N'-[4-(4-diphenylamino)--.

Column 6, Line 61; Change "methacryla mide]" to --methacrylamide]--.

Column 7, Line 10; Change "antryl)" to --anthryl)--.

Column 7, Line 18; Change "[N,N,N" to --[N,N',N'--.

Column 7, Line 18; Change "phen ylenediamine]" to --phenylenediamine]--.

Column 7, Line 21; Change "N,N,N" to --N,N',N'--.

Column 7, Line 41; Change "]-4H-pyra n-4-ylidene}" to --]-4H-pyran-4-ylidene}--.

Column 7, Line 55; Change "quinoli zin" to --quinolizin--.

Column 8, Line 5; Change "bis[2-(4-perfluorophenylphenyl)" to --bis[2-(4'-perfluorophenylphenyl)--.

Column 13, Line 3; Change "AlLi)," to --AlLi),--.

Column 16, Line 58; Change "forger vein," to --finger vein,--.

Signed and Sealed this
Fifth Day of May, 2015

Michelle K. Lee
*Director of the United States Patent and Trademark Office*